United States Patent
Kakinoki et al.

(10) Patent No.: US 7,375,972 B2
(45) Date of Patent: May 20, 2008

(54) APPEARANCE PROTECTIVE CASE AND APPEARANCE PROTECTIVE CASE ASSEMBLY

(75) Inventors: Wataru Kakinoki, Yokohama (JP); Hiroaki Fukuchi, Sagamihara (JP); Katsuo Ito, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 147 days.

(21) Appl. No.: 10/642,283

(22) Filed: Aug. 18, 2003

(65) Prior Publication Data

US 2004/0040871 A1    Mar. 4, 2004

(30) Foreign Application Priority Data

Aug. 27, 2002    (JP)    ............ 2002-247606

(51) Int. Cl.
H05K 5/02    (2006.01)

(52) U.S. Cl. ............ 361/737; 361/752; 361/730; 174/520; 235/492; 257/679

(58) Field of Classification Search ............ 361/625, 361/633, 636, 640, 658, 680–682, 752, 753, 361/756, 759, 761, 801, 802, 763, 796–799, 361/686, 737, 728, 730, 736, 733; 206/315.1, 206/443, 579, 320, 305; 220/839; 174/520; 257/678, 679; 235/492; 200/320.2

See application file for complete search history.

(56) References Cited

U.S. PATENT DOCUMENTS

| | | | | |
|---|---|---|---|---|
| 5,011,010 | A | * | 4/1991 | Francis et al. ............ 206/307 |
| 5,101,971 | A | * | 4/1992 | Grobecker ............ 206/232 |
| 5,259,498 | A | * | 11/1993 | Weisburn et al. ............ 206/756 |
| 5,864,463 | A | * | 1/1999 | Tsukada et al. ............ 361/686 |
| 6,097,591 | A | * | 8/2000 | Ircha ............ 361/683 |
| 6,119,857 | A | * | 9/2000 | Stumpff ............ 206/308.1 |
| 6,233,856 | B1 | * | 5/2001 | Haugk et al. ............ 40/310 |

(Continued)

FOREIGN PATENT DOCUMENTS

CN    87200778 U    10/1987

(Continued)

OTHER PUBLICATIONS

Official Communication cited in corresponding Japanese Patent Application No. 2002-247606, dated Aug. 15, 2006.

(Continued)

*Primary Examiner*—Jeremy C. Norris
*Assistant Examiner*—Dameon E Levi
(74) *Attorney, Agent, or Firm*—Keating & Bennett, LLP

(57) ABSTRACT

An appearance protective case and an appearance protective case assembly are provided in which damage of a colored or marked pattern due to exposure is prevented, and in which the structure of a formed member having the colored or marked pattern printed thereon is made simple so that the formed member is easily incorporated into the appearance protective case. The appearance protective case includes a sheet-like formed member formed by draw-processing a sheet-like member treated with coloring or marking and a transparent or translucent cover case, and is assembled by fitting the sheet-like formed member into the cover case such that the sheet-like formed member extends in close contact with the inner surface of the cover case.

12 Claims, 6 Drawing Sheets

U.S. PATENT DOCUMENTS

| | | | |
|---|---|---|---|
| 6,295,221 B1* | 9/2001 | Iwasaki et al. | 365/63 |
| 6,413,630 B1* | 7/2002 | Nakayama | 428/344 |
| 6,438,638 B1* | 8/2002 | Jones et al. | 710/301 |
| 6,456,500 B1* | 9/2002 | Chen | 361/752 |
| 6,459,460 B1* | 10/2002 | Yamanaka | 349/58 |
| 6,462,939 B1* | 10/2002 | Heirich | 361/682 |
| 6,483,712 B1* | 11/2002 | Oliphant et al. | 361/737 |
| 6,490,163 B1* | 12/2002 | Pua et al. | 361/752 |
| 6,608,749 B2* | 8/2003 | Hubbard | 361/683 |
| 6,650,534 B2* | 11/2003 | Tree | 361/686 |
| 6,671,808 B1* | 12/2003 | Abbott et al. | 726/4 |
| 6,776,282 B2* | 8/2004 | Lafleur | 206/308.1 |
| 6,797,317 B2* | 9/2004 | Ferro | 427/148 |
| 6,844,872 B1* | 1/2005 | Farag et al. | 345/163 |
| 6,862,148 B2* | 3/2005 | Kakinoki et al. | 359/808 |
| 6,891,721 B2* | 5/2005 | Huang | 361/685 |
| 7,008,240 B1* | 3/2006 | Wang et al. | 439/76.1 |
| 2004/0145566 A1* | 7/2004 | Tsai | 345/163 |

FOREIGN PATENT DOCUMENTS

| | | |
|---|---|---|
| CN | 2125985 U | 12/1992 |
| JP | 5-29744 | 4/1993 |
| JP | 05-169611 A | 7/1993 |
| JP | 08-018246 A | 1/1996 |
| JP | 08-079104 A | 3/1996 |
| JP | 11-047347 A | 2/1999 |
| JP | 11-126536 A | 5/1999 |
| JP | 2000-318052 A | 11/2000 |
| JP | 2001-007549 A | 1/2001 |

OTHER PUBLICATIONS

Notice of the First Office Action Issued in the corresponding Chinese Patent Application No. 03157753.9 dated May 13, 2005.

* cited by examiner

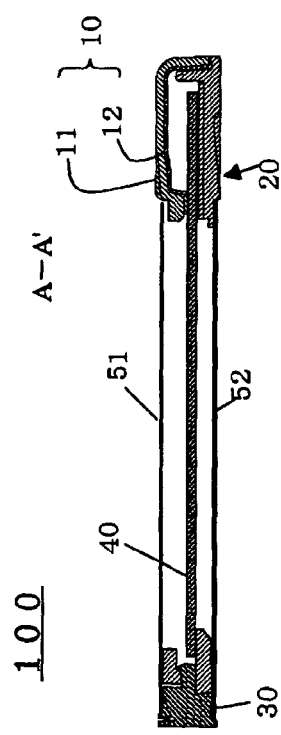
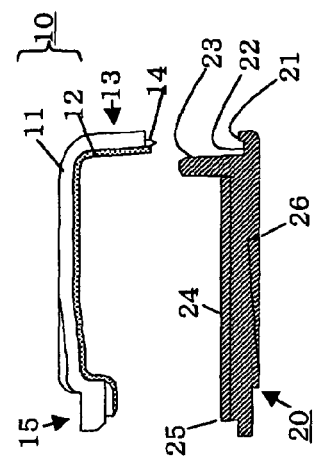
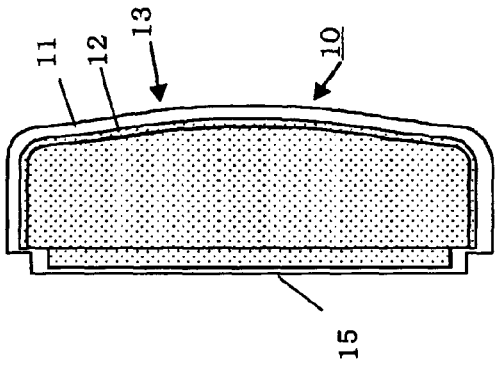
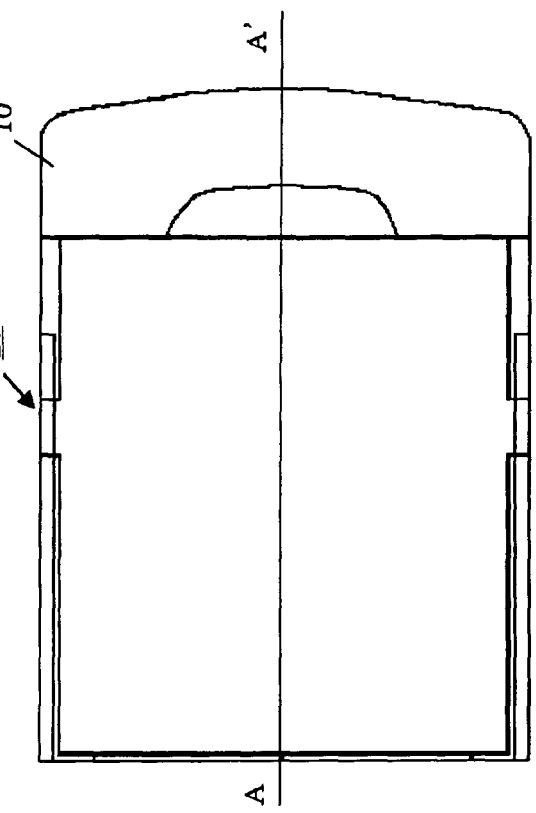
FIG. 1A
FIG. 1B
FIG. 1C
FIG. 1D

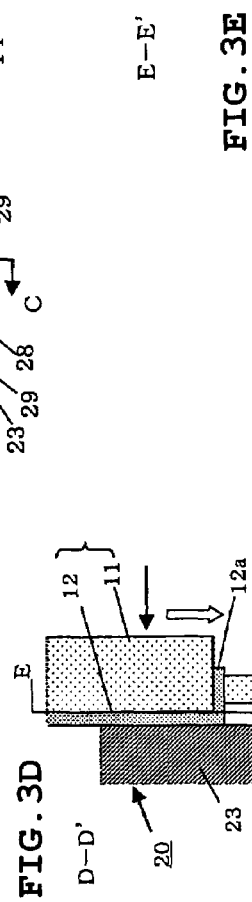
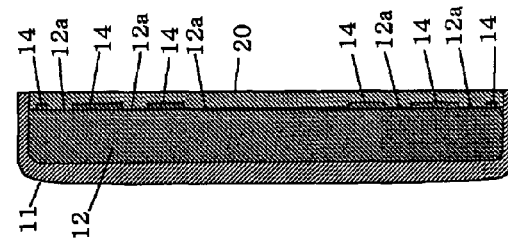
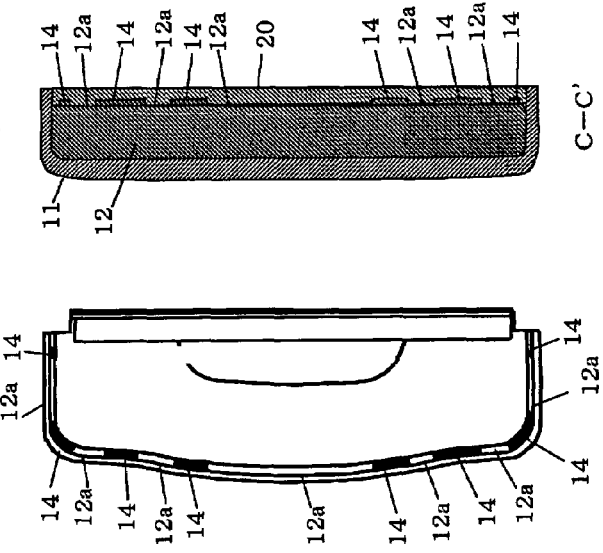
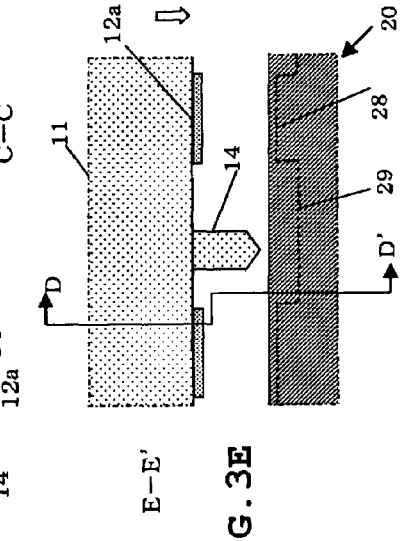
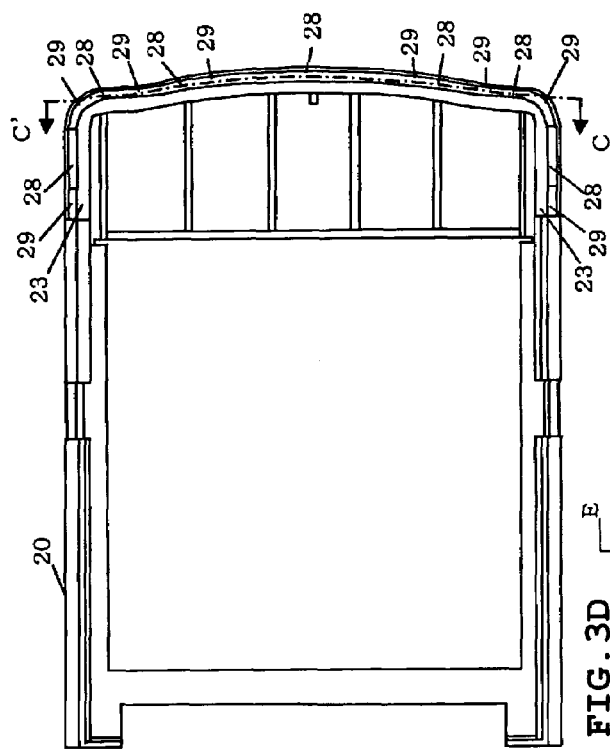

A-B'

A-A'

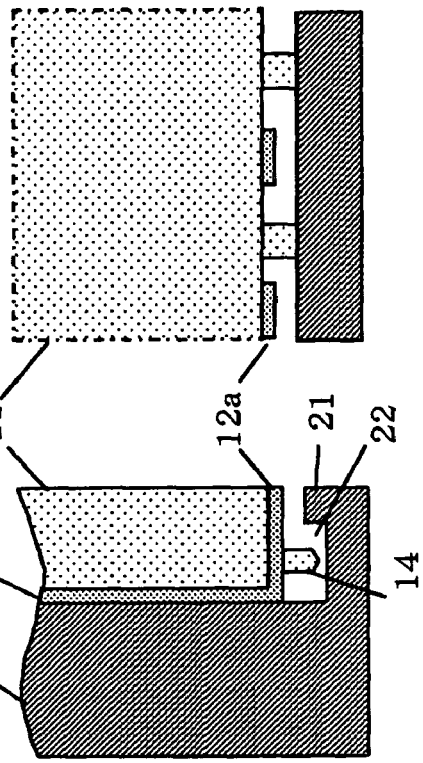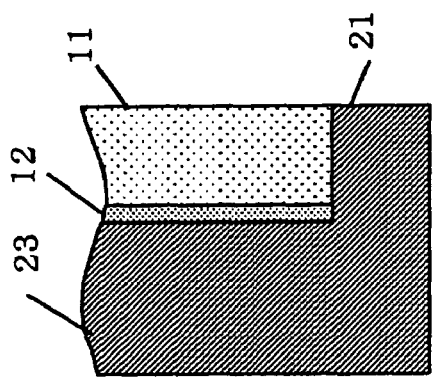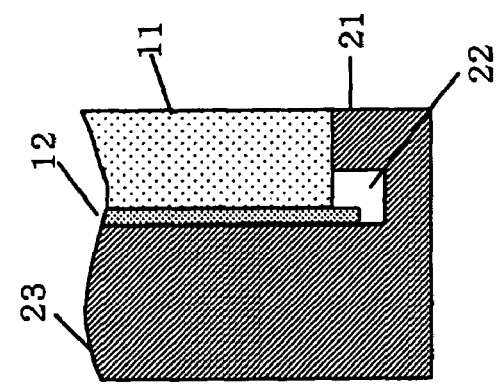

APPEARANCE PROTECTIVE CASE AND APPEARANCE PROTECTIVE CASE ASSEMBLY

BACKGROUND OF THE INVENTION

1. Field of the Invention

The present invention relates to a protective case for protecting resin or other suitable material used for an external appearance surface of a personal computer (PC) card, a Compact Flash™ (CF) card, or other suitable device, and more particularly, the present invention relates to an appearance protective case for protecting a marked pattern or other indicia printed on the appearance surface thereof and an appearance protective-case-assembly including the appearance protective case.

2. Description of the Related Art

A PC card, a memory stick, a multimedia card, a CF card, and other such devices are widely used as a memory card or an I/O card for use in a personal computer and for communication and/or industrial use. Each such card or device has a marking pattern such as a logo that is painted or printed (hereinafter, simply referred to as printed) thereon.

Previously, a resin case has been used as an external appearance surface of an extension (i.e., a portion for storing a transmitting antenna or other element) of a PC card or a CF card. Also, the front surface of the resin case has been treated for better appearance with embossing for having a satin pattern formed thereon, with painting, or with silk-screen printing, or has had a marked pattern such as a mark or a logo printed thereon.

In the case of painting, although it is easy to paint the entire surface of the case with a single color, when a pattern is painted with two or three colors or when it is required to refrain from applying a paint material on the rear surface thereof, a masking step is needed, and also a masking jig and a masking tape are needed, thereby resulting in additional working tools and an additional working step. In addition, insufficient masking sometimes causes a stain to be produced in the boundary between the masking tape and the paint, thereby leading to deteriorated appearance.

In the case of silk-screen printing, it is necessary to print an individual product of the resin cases piece by piece with a screen plate, thereby causing a complicated work. Also, the number of steps of silk-screen printing increases as the number of colors increases, thereby resulting in an increased work load.

In addition, when the resin case is treated with embossing, although its appearance quality can be improved by changing the visual appearance of its surface, it is impossible to change its color by changing its reflection characteristics with embossing. As a result, there is a limit to the amount of expressiveness that can be achieved.

In any of the above-described methods, since a marked pattern or other indicia is printed on the front surface of the resin case, rubbing or deterioration during use causes the marked pattern or indicia to be eventually erased.

To solve the above-described problem, a method in which a transparent case is used and the inner surface of the case is treated with painting or printing has been proposed. However, since this method has drawbacks such as a very difficult masking work, an extraordinarily increased number of working steps, and a dirty appearance due to pooled ink produced during painting, this method has not been implemented.

As disclosed in Japanese Unexamined Utility Model Registration Application Publication No. 5-29744, there is a method in which a decorative sheet has a transparent surface layer formed on the front surface thereof and is drawn by pneumatic molding and then is cut, and the cut decorative sheet is inserted into a molded component so as to assemble a cover case. However, this method has drawbacks such as the requirement that an additional step of setting the drawn and cut sheet to be molded in a molding die be performed, and a damaged appearance of the decorative sheet caused by heat and a shearing force applied on the sheet to be molded during insert-forming.

SUMMARY OF THE INVENTION

In order to overcome the problems described above, preferred embodiments of the present invention provide an appearance protective case and an appearance protective-case-assembly in which damage of a colored or marked pattern due to exposure is prevented, and the structure of a formed member having the colored or marked pattern printed thereon is made simple so that the formed member can be easily incorporated into the appearance protective case.

In accordance with a preferred embodiment of the present invention, an appearance protective case includes a sheet-like formed member formed by draw-processing a sheet-like member treated with coloring or marking, and a transparent or translucent cover case. The appearance protective case is assembled by fitting the sheet-like formed member into the cover case such that the sheet-like formed member extends in close contact with the inner surface of the cover case. In the description of the present invention, the term "coloring" means an action for obtaining a sheet-like member, other than a evenly transparent and colorless or translucent one, by printing or painting it with a single color, a combination of a plurality of colors, or by providing a gradation in these colors. Also, the term "marking" means an action for obtaining a sheet-like member other than a plain one by printing or painting it with a symbol, a letter, a figure, and/or the like. In addition, the term "draw-processing" means any known forming method for forming a sheet-like member which extends two-dimensionally when its depth is neglected into a three-dimensionally extending sheet-like member by deforming or molding. Example known methods include a pneumatic molding method, a vacuum molding method, and another molding method for forming a sheet-like formed member, respectively, by pressing a sheet-like member on a molding die with an air pressure while applying heat, by stretching a sheet-like member set in a molding die having a hole in a vacuum state produced by sucking air in the molding die, and by press-drawing a sheet-like member while maintaining a molding die at a fixed temperature.

(2) In the appearance protective case according to present invention, the sheet-like formed member may be formed by a decorative film composed of resin.

(3) In the appearance protective case according to the present invention, the decorative film may be formed by a transparent film having a rear surface treated with coloring or marking.

(4) In the appearance protective case according to the present invention, the decorative film may have a front surface treated with coloring or marking.

(5) In the appearance protective case according to the present invention, the sheet-like member may be made from paper.

(6) In the appearance protective case according to the present invention, the sheet-like member may be made from a metal sheet.

(7) In the appearance protective case according to the present invention, the cover case and the sheet-like member may be firmly fixed to each other.

(8) In accordance with another aspect of the present invention, an appearance protective-case-assembly includes a frame having a groove formed along at least one side thereof; and the sheet-like formed member according to the present invention. At least one side of the sheet-like formed member is inserted into the groove of the frame, and the foregoing cover case and the frame are firmly fixed to each other so as to sandwich and hold a portion of the sheet-like formed member, including said at least one side.

(9) In the appearance protective-case-assembly according to the present invention, the sheet-like formed member may have at least one flange disposed at the front thereof such that the flange is sandwiched and held by the cover case and the frame.

(10) The appearance protective-case-assembly according to the present invention may further include a circuit board. The circuit board is sandwiched and held by the appearance protective case and the frame such that the sheet-like formed member and the frame lie in contact with opposing surfaces of the circuit board.

(11) The appearance protective-case-assembly according to the present invention may further include an upper metal cover firmly fixed to the cover case and the frame, and a lower metal cover firmly fixed to the frame such that at least a colored or marked pattern printed on the sheet-like formed member is exposed.

According to the present invention, the appearance protective case is formed by the sheet-like formed member formed by draw-processing the sheet-like member treated with coloring or marking and by the transparent or translucent cover case, and is assembled by fitting the sheet-like formed member into the cover case so as to extend along the inner surface of the cover case. As a result, the appearance protective case has a simple structure achieved by fabricating the sheet-like formed member, having a colored or marked pattern printed thereon, only by draw-processing the sheet-like member, and is easily fixed to the frame since the sheet-like formed member and the cover case are united as the appearance protective case. Also, damage of the colored or marked pattern due to exposure is prevented.

Since the decorative film is disposed in the inner side of the cover case, a colored or marked pattern is prevented from being erased due to rubbing or the like. Also, since the cover film is simply fitted to the inner surface of the cover case, a simple structure and an easy production are achieved.

Since said at least one flange is formed at the front of the decorative film and is sandwiched and held by the cover case and the frame, the decorative film is precisely positioned and firmly fixed.

Since the groove is formed in the frame, melted resin produced during supersonic-welding is pooled in the groove without flowing out of the groove. When at least one step is formed in the groove, the fixing position of the corresponding flange can be precisely set.

Since the decorative film is securely fixed while being sandwiched and held, a deformation of the decorative film caused by draw-processing is removed, and a distorted deformation of the decorative film caused by its expansion and contraction due to an environmental change or the like after assembly is prevented.

When the decorative film is made from metal, the appearance protective case is provided with an electromagnetic shield effect.

Other features, elements, characteristics and advantages of the present invention will become more apparent from the following detailed description of preferred embodiments thereof with reference to the attached figures.

BRIEF DESCRIPTION OF THE DRAWINGS

FIGS. 1A to 1D illustrate the structure of a Compact Flash™ (CF) card according to a first preferred embodiment of the present invention;

FIGS. 3A to 3E illustrate the structure of a modified CF card according to a second preferred embodiment of the present invention;

FIGS. 5A to 5D illustrate the structures of major portions of modified CF cards according to third to fifth preferred embodiments of the present invention.

DETAILED DESCRIPTION OF PREFERRED EMBODIMENTS

Figure 2:
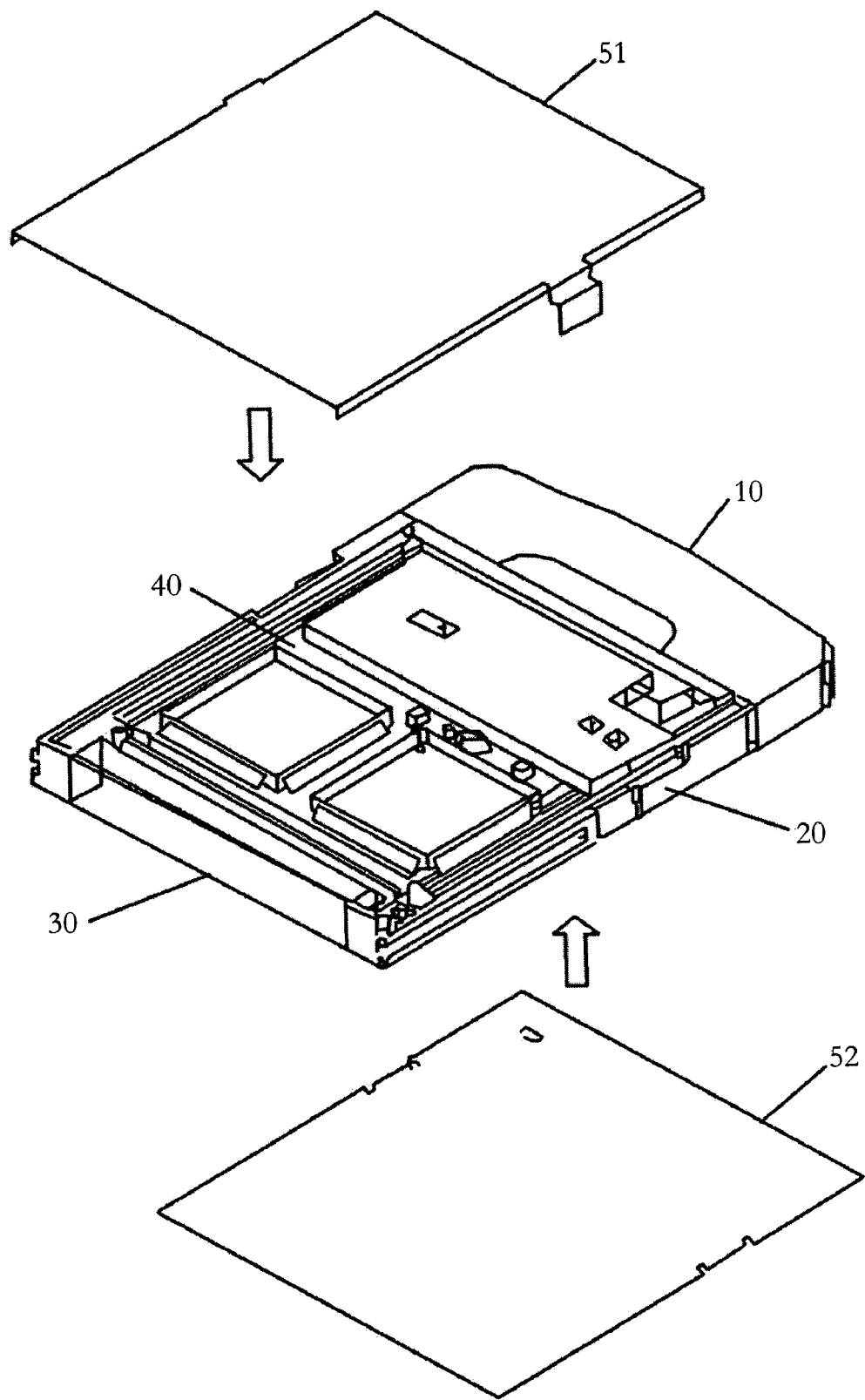
FIG. 2 is an exploded view of the CF card according to the first preferred embodiment of the present invention.

Preferred embodiments of the present invention will be described with reference to the accompanying drawings.

First Preferred Embodiment

FIGS. 1A to 1D show a first preferred embodiment of the present invention, illustrating the structure of a Compact Flash™ (CF) card to which the present invention is preferably applied. In particular, FIGS. 1A to 1D illustrate an example CF card in which a sheet-like formed member preferably formed by draw-processing a sheet-like member treated with coloring or marking defines an appearance protective case according to a preferred embodiment of the present invention.

The term "sheet-like member" means a sheet-like structure made from at least one of a variety of materials including a film, paper, and metal. Also, the term "sheet-like formed member" means a member formed by treating the sheet-like member with draw-processing or other suitable process.

FIG. 1A is a sectional view of the CF card to which a preferred embodiment of the present invention is applied, taken along the line A-A' indicated in FIG. 1D.

As shown in the figure, a CF card 100 includes a frame 20 providing the overall frame of the CF card, a circuit board 40 having an interface circuit, a memory, a controller, and other suitable elements (all not shown) mounted thereon, an input/output connector 30 of the circuit board 40, connected to the circuit board 40 and retained to the frame 20, an appearance protective case 10 forming an extension (a portion for storing an antenna and/or other element) of the CF card, together with a portion of the frame 20 facing the appearance protective case 10, and upper and lower metal covers 51 and 52 fixed to the frame 20 and mainly covering the circuit board 40.

The upper metal cover 51 covers the appearance protective case 10 such that a colored or marked pattern of a decorative film 12 of the appearance protective case 10 is exposed. Also, the lower metal cover 52 is arranged so as to face the upper metal cover 51 and covers the portion of the frame 20 facing the appearance protective case 10.

The appearance protective case 10 is preferably formed by a transparent or translucent cover case 11 disposed outside and the decorative film 12 fitted to the inner surface of the cover case 11. The appearance protective case 10 has a right side (in FIG. 1A) falling almost vertically and is guided and supported by a portion of the frame 20 rising almost vertically.

The CF card 100 has a card structure as an overall structure in which the frame 20 holds the front connector 30 and the circuit board 40 having circuit components mounted thereon. The decorative film 12 and the transparent or translucent cover case 11 are firmly fixed to one side of the frame 20. The upper metal cover 51 is firmly fixed to the frame 20 and the cover case 11 and the lower metal cover 52 is firmly fixed to the frame 20.

FIG. 1B is a magnified view of the appearance protective case 10 and the frame 20 shown in FIG. 1A.

The appearance protective case 10 is defined by the cover case 11 and the decorative film 12, and has an approximate C-shape as a whole and a storage space provided therein.

The circuit board 40 is sandwiched and held by an upper supporting portion 15 of the appearance protective case 10 and a lower supporting portion 25 of the frame 20.

The cover case 11 is preferably made of a transparent or translucent resin material having an approximately predetermined thickness and has an appropriate stiffness in order to prevent distortion or deformation of the decorative film 12 fitted to the inner surface of the cover case 11. The front surface of the cover case 11 may be formed so as to have a convex lens shape in order to magnify a marked pattern or other indicia on the decorative film 12 disposed in the inner side of the cover case 11.

The decorative film 12 is preferably made from a sheet-like thermo-plastic having a predetermined thickness and is formed by a manufacturing process such as vacuum molding or pneumatic molding so as to provide a similar figure to the cover case 11.

Since the decorative film 12 can printed in a flat film state before it is treated with draw-processing by using a pneumatic molding die or other suitable tool, the coloring or marking can be delicately and elaborately performed. Also, a large number of the decorative films 12 can be printed during manufacturing by imposition, thereby resulting in a low printing cost.

The decorative film 12 preferably includes at least one of a letter, a symbol, a figure, a color painting, or other suitable indicia on a side surface or the whole surface thereof, and has an appropriate thickness depending on its plastic material so as not to be deformed or distorted due to its own weight. Preferably, the thickness does not exceed about 0.2 mm as long as the above conditions are satisfied.

The decorative film 12 is preferably formed by pneumatic molding or other suitable process into a shape in which the sheet-like formed member extends in close contact with the inner surface of the transparent or translucent cover case 11 and is fitted to the inner surface of the cover case 11. After then, the decorative film 12 is held by the cover case 11 by its own elastic force. If needed, the decorative film 12 is firmly fixed to the cover case 11 by ultrasonic welding for preventing its displacement or the like.

As shown in FIG. 1B, the frame 20 is formed by a horizontal frame 26 for having the circuit board (not shown) placed thereon, a horizontal portion 24 disposed on the horizontal frame 26, an edge 21, a groove 22, and a rising portion 23 disposed at the right side of the frame 20 from right to left in that order, and the lower supporting portion 25 disposed at the leftmost side of the horizontal portion 24.

In the first preferred embodiment, the cover case 11 is firmly fixed to the frame 20 by supersonic welding or other suitable process. In a state in which the depressions of the decorative film 12 and the cover case 11 formed by draw-processing are elastically engaged with each other, the decorative film 12 and protrusions 14 serving as supersonic welding margins (energy directors) formed at the front of a falling portion 13 formed at the right side (backside) of the decorative film 12 are fitted into the groove 22 of the frame 20. That is, since the rising portion 23 is formed in a standing manner so as to define the groove 22 in the frame 20, by moving down the falling portion 13 of the cover case 11 along the rising portion 23 so as to press the decorative film 12 lying in the inner side of the cover case 11 in contact with the falling portion 13, the protrusions 14 at the front of the cover case 11 are fitted into the groove 22 of the frame 20 and are firmly fixed thereto by supersonic welding.

As described above, since the use of the protrusions 14 allows one side of the cover case 11 to be firmly fixed to the frame 20 by supersonic welding, a left portion (front side portion) of the decorative film 12 facing the upper supporting portion 15 extending at the leftmost of the cover case 11 is pressed down together with the circuit board 40 toward the frame 20 by the cover case 11. Although the decorative film 12 is fitted to the inner surface of the cover case 11 so as to prevent displacement of the decorative film 12, the displacement can be further inhibited with the above-described pressing. Meanwhile, the displacement can be prevented by the dimensional relationship between the decorative film 12 and the cover case 11 without forming the rising portion 23.

The decorative film 12 has an appropriate stiffness so as not to be distorted or deformed with its own weight, and also has an appropriate elastic force so as to be engaged with the cover case 11. Thus, the decorative film 12 lies in close contact with the mutually intersecting three inner surfaces of the cover case 11 due to its elasticity.

It is possible to set a draw-processing height of the decorative film 12 and the inner height of the cover case 11 so as to prevent the decorative film 12 from moving inside the cover case 11 during mounting.

When inner corners of the cover case 11 are formed so as to have curved surfaces, outer corners of the decorative film 12 corresponding to the foregoing corners can be deformed so as to have similar curved surfaces due to its elasticity.

Although a conventional CF card has a problem in that when the decorative film 12 is fitted into the cover case 11, the corners of the decorative film 12 are distorted due to an insertion friction or the like and sometimes are damaged, with the above-described arrangement according to the first preferred embodiment of the present invention, the cover case 11 and the decorative film 12 can be engaged with each other in a close contact manner by making each corner round, thereby preventing the corners from being damaged. Also, making the corners round allows the decorative film 12 to be formed easily.

A plastic material constituting the above-mentioned decorative film 12 is preferably selected from a variety of resins including polystyrene, acrylonitrile-butadiene-styrene copolymer, acrylonitrile-styrene copolymer, polyvinyl chloride, methacrylic resin, cellulosic resin, polycarbonate, polyethylene, polypropylene, polyvinylidene chloride, polyacetal, polyamide, and fluorocarbon resin, taking the characteristics of each resin into account.

FIG. 1C is a bottom view of the appearance protective case 10 shown in FIG. 1B. The falling portion 13 of the cover case 11 and a falling portion of the decorative film 12 extending in close contact with the falling portion 13 are preferably formed in an approximate C-shape, as indicated by solid lines in FIG. 1C. Also, the upper supporting portion 15 of the cover case 11 and a portion of the decorative film 12 substantially facing the upper supporting portion 15 are preferably formed in a substantially rectangular shape, as shown at the left side in FIG. 1C. Since the depression of the decorative film 12 has a considerably large area, a colored or marked pattern such as a figure or a letter can be printed on the surface of the depression. A colored or marked pattern is printed on the front surface of the decorative film 12 and also on the rear surface thereof having a transparent or translucent layer interposed therebetween.

The appearance protective case 10 shown in FIG. 1C is aligned with and is firmly fixed to the right portion of the frame 20, as shown in FIG. 1D.

FIG. 1D is a top view of the CF card 100 with the appearance protective case 10 being mounted. The actually mounting state of the CF card 100 is shown in FIG. 2.

FIG. 2 is an exploded view of the CF card according to the first preferred embodiment of the present invention.

As shown in FIG. 2, the circuit board 40 is mounted on the frame 20, and the front connector 30 is connected to the circuit board 40 and is fixed to the frame 20. In this state, the upper and lower metal covers 51 and 52 are fixed to the frame 20 from above and below, respectively.

Advantages of the First Preferred Embodiment

In the first preferred embodiment, the decorative film 12 is disposed in the inner portion of the cover case 11, thereby preventing a colored or marked pattern printed on the appearance surface of the decorative film 12 from being erased due to rubbing or the like. Also, the decorative film 12 is simply fitted to the inner surface of the cover case 11, thereby achieving a simple structure of the appearance protective case 10 and thus allowing it to be easily manufactured. In addition, a colored or marked pattern can be easily changed only by replacing the decorative film 12 with another one.

Second Preferred Embodiment

FIGS. 3A to 3E show a second preferred embodiment of the present invention, illustrating the structure of a modified CF card in which the decorative frame 12 according to the first preferred embodiment has flanges 12a formed thereto as shown in FIGS. 3B to 3E. FIG. 3A is a top view of the frame 20. FIG. 3B is a rear view of the appearance protective case 10, illustrating a state in which the decorative film 12 is fitted into the cover case 11. FIGS. 3C, 3D, and 3E are sectional views of the CF card, taken along the lines C-C', D-D', and E-E' indicated in FIGS. 3A, 3E, and 3D, respectively.

Figure 4B:
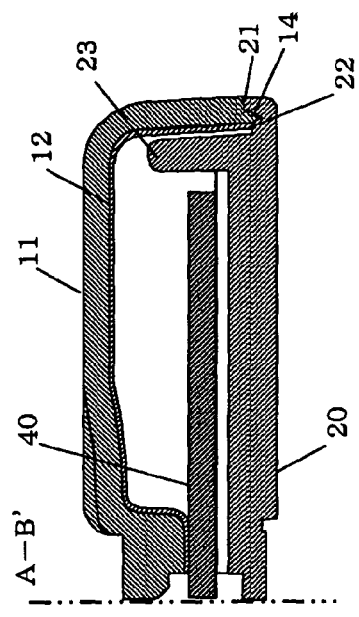
FIGS. 4A to 4C illustrate the structure of a major portion of the modified CF card according to the second preferred embodiment of the present invention.
Figure 4C:
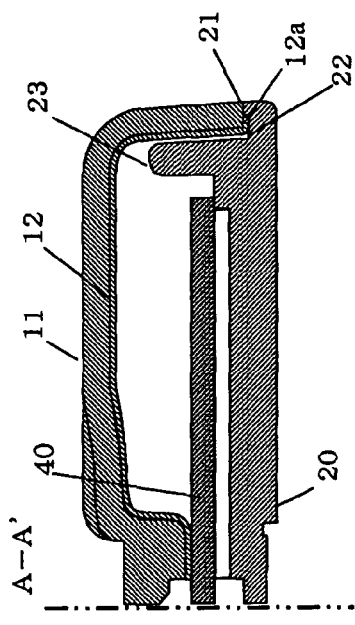
Figure 4A:
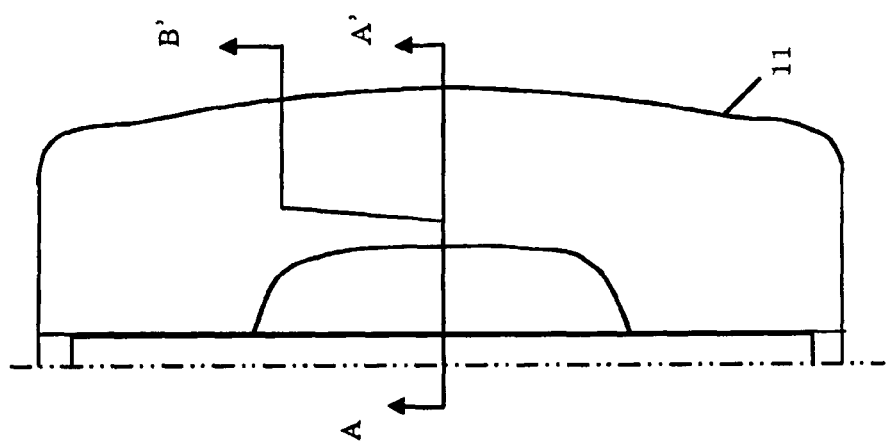

FIGS. 4A to 4C also show the second preferred embodiment, illustrating different portions of the CF card. FIG. 4A is a top view of the right part of the CF card including the appearance protective case combined with the frame. FIGS. 4B and 4C are sectional views of the right portion of the CF card, taken along the lines A-B' and A-A', respectively.

As shown in FIG. 3A, the frame 20 has the rising portion 23 continuously formed along the right periphery thereof so as to have an approximate C-shape as a whole.

The structure of the CF card around the rising portion 23 is shown in FIGS. 4B and 4C. The frame 20 has the groove 22 and the edge 21 continuing into the rising portion 23.

Meanwhile, the cover case 11 having the decorative film 12 fitted thereinto abuts against and is fixed to the edge 21 while the protrusions 14 or the flanges 12a are being inserted into the groove 22. In this state, the circuit board 40 is sandwiched and held by the cover case 11 having the decorative film 12 fitted thereinto and the frame 20.

The relationship between the groove 22 and the protrusions 14 or the flanges 12a will be now described in detail. The rising portion 23 has the groove 22 connected to and extending along the outer periphery thereof, as shown in FIG. 3D. The groove 22 has steps 28 facing the flanges 12a and depressions 29 between the adjacent steps 28, the steps 28 and the depressions 29 being alternately formed therein, as shown in FIG. 3E. FIG. 3A shows a state in which the steps 28 and the depressions 29 are continuously disposed.

The decorative film 12 has the flanges 12a formed at the front thereof so as to be substantially perpendicular thereto, as shown in FIG. 3D. Each flange 12a has a width substantially equal to that of the groove 22, as shown in FIG. 3D, and can be of any length in the extending direction of the groove 22 as long as each protrusion 14 can be interposed between the adjacent flanges 12a.

The flanges 12a are arranged so as not to contact with the protrusions 14, as shown in FIG. 3E. The steps 28 are arranged in the groove of the frame 20 so as to face the corresponding flanges 12a. The height of the steps 28 is set such that the flanges 12a can be sandwiched and held between the bottom surface of the cover case 11 and the top surfaces of the corresponding steps 28 in a state in which the bottom of the cover case 11 abuts against the edge 21 of the frame 20.

In a state in which the decorative film 12 and the cover case 11 are combined as shown in FIGS. 3D and 3E, when a supersonic wave is applied to them while moving them down in the direction of the arrows indicated in the figures, the protrusions 14 are melted while abutting against the front surface of the groove 22, a melted resin portion of each protrusion 14 fixedly adheres the remaining portion of the protrusion 14 to the frame 20. In this stage, the flanges 12a are aligned and disposed on the corresponding steps 28 in the groove 22.

FIG. 3C shows a state in which the flanges 12a are fixed by the cover case 11 and the corresponding steps 28 of the frame 20. Meanwhile, the line C-C' indicated in FIG. 3A extends along the same cut surface as the line E-E' indicated in FIG. 3D does.

The groove 22 having a recessed cross-section acts to prevent the melted resin from flowing out of the groove 22. Each protrusion 14 can be of any shape as long as its front extending towards the groove 22 has a protruding shape.

A colored or marked pattern is printed on the front surface of the decorative film 12 and the rear surface thereof, having a transparent or translucent layer interposed therebetween.

Advantages of the Second Preferred Embodiment

In the second preferred embodiment, since the steps 28 are formed in the groove 22 of the frame 20 and the flanges 12a are formed on the decorative film 12 so as to align with the corresponding steps 28, the flanges 12a can be sandwiched and positioned by the cover case 11 and the corresponding steps 28 of the frame 20. Also, the CF card has a structure in which the melted resin of the protrusions 14 is pooled in the depressions 29 of the frame 20, thereby preventing the melted resin from flowing into other portions of the CF card where no melted resin is needed.

Furthermore, in addition to having the same advantages of the first preferred embodiment, the decorative film 12 is securely fixed because of being sandwiched and held, thereby removing deformation of the decorative film caused by draw-processing, and preventing distorted deformation of the decorative film caused by its expansion and contraction due to an environmental change or the like after assembly.

Third Preferred Embodiment

FIG. 5A illustrates the structures of the cover case, the decorative film, and the frame of a modified CF card according to a third preferred embodiment of the present invention. The bottom of the decorative film 12 extends straight beyond the bottom of the cover case 11 and the decorative film 12 and lies in the groove 22. In a state in which the above components are combined as shown in FIG. 5A, the bottom surface of the cover case 11 and the upper surface of the edge 21 of the frame are firmly fixed with an adhesive. A colored or marked pattern is printed on the front surface of the decorative film 12 and the rear surface thereof, having the transparent or translucent layer interposed therebetween.

Advantages of the Third Preferred Embodiment

With the above-described structures, even when the decorative film 12 has a burr produced during manufacturing, an uneven shape caused by cutting, or the like, at the bottom thereof, these defects can be hidden in the groove 22, thereby improving an ornamental appearance.

Fourth Preferred Embodiment

FIG. 5B illustrates the structures of the cover case, the decorative film, and the frame of a modified CF card according to a fourth preferred embodiment of the present invention. The bottom surfaces of the decorative film 12 and the cover case 11 which are combined together are firmly fixed by an adhesive to the upper flat surface of the edge 21 of the frame having a substantially L-shaped cross-section while being aligned with the upper flat surface. A colored or marked pattern is printed on the front surface of the decorative film 12 and the rear surface thereof, having the transparent or translucent layer interposed therebetween.

Advantages of the Fourth Preferred Embodiment

With the above-described structures, the decorative film 12 and the cover case 11 are aligned on the upper flat surface of the edge 21, thereby making the positioning of these components easy.

Fifth Preferred Embodiment

FIGS. 5C and 5D show a major portion of a modified CF card according to a fifth preferred embodiment of the present invention, as a modification of the CF card according to the second preferred embodiment shown in FIGS. 3A to 3E. While the CF card according to the second preferred embodiment has a structure in which the flanges 12a face the corresponding steps 28 and are sandwiched and held by the cover case 11 and the steps 28, the modified CF card according the fifth preferred embodiment has a structure in which the flanges 12a are sandwiched by the cover case 11 and the edge 21 since the steps 28 are not formed. The protrusions 14 are arranged so as to lie between the adjacent flanges 12a in the same manner as in the second preferred embodiment and are used for supersonic welding. A colored or marked pattern is printed on the front surface of the decorative film 12 and the rear surface thereof, having the transparent or translucent layer interposed therebetween.

Advantages of the Fifth Preferred Embodiment

The groove 22 for pooling the melted resin has a simple structure since the steps needed in the second preferred embodiment are not formed therein, and also, the flanges 12a are easily sandwiched and held by the cover case 11 and the edge 21.

Sixth Preferred Embodiment

Figure 6A:
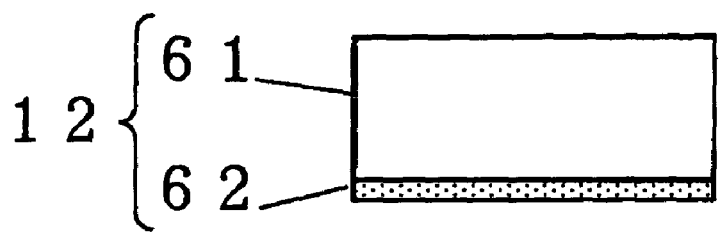
FIGS. 6A to 6C illustrate the structure of a modified decorative film of a modified CF card according to a sixth preferred embodiment of the present invention.
Figure 6B:
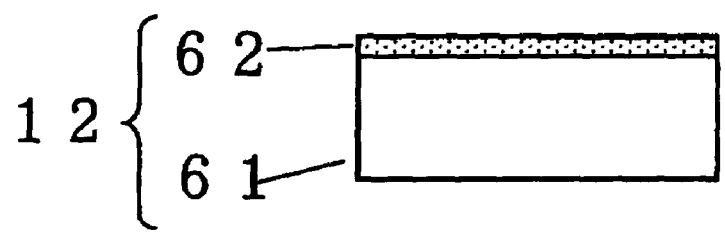
Figure 6C:
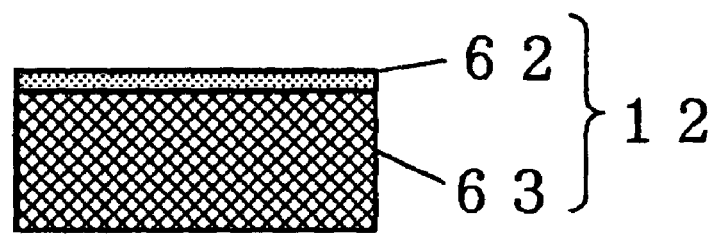

FIGS. 6A to 6C are magnified sectional views of the decorative film 12 as a major portion of a modified CF card according to a sixth preferred embodiment of the present invention. FIG. 6A illustrates an example sectional structure of the decorative film 12 having a transparent film resin 61 formed on the front surface thereof and a colored or marked layer 62 formed on the rear surface thereof. The colored or marked layer 62 is preferably formed, for example, by printing or painting. When a base material of the decorative film 12 is the same as the transparent film resin 61, the decorative film 12 may have the colored or marked layer 62 on the front surface side thereof as shown in FIG. 6B on the contrary of the sectional structure shown in FIG. 6A. FIG. 6C illustrates an example sectional structure of the decorative film 12 having the colored or marked layer 62 on the front surface side thereof. The colored or marked layer 62 is formed, for example, by printing or painting. An opaque film base material 63 can be used on the rear surface. Any material, for example, even paper or metal, can be used for the film base material 63 as long as it can be subjected to draw-processing such as pneumatic molding. Usable metals include stainless steel, copper, brass, aluminum, and white metal.

Advantages of the Sixth Preferred Embodiment

According to the sixth preferred embodiment, the material of the film base material 63 can be selected from paper, metal, or other suitable material depending on its requirements. When the film base material 63 is made from metal such as stainless steel, copper, brass, aluminum, or white metal, the decorative film 12 is provided with an electromagnetic shield effect. In this case, a colored or marked pattern is printed on the front surface of the film base material.

Other Preferred Embodiments

Although, in the above-described preferred embodiments, the cover case 11 and the frame 20 are bonded together by firmly fixing processes and materials including supersonic welding and an adhesive, another type of reliable fixing devices such as a claw structure for adhering and retaining, press-fitting, or screw-cramping is also applicable.

Also, the decorative film may have an ultraviolet-ray preventive layer formed thereon. In addition, when the foregoing electromagnetic shield material is used as the film base material, and when the antenna in the extension is used, the antenna is stretched out from the electromagnetic shield material so as to be exposed.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A card-like computer peripheral device, comprising:
   a frame;
   upper and lower covers disposed on upper and lower sides of the frame;
   a circuit board disposed within the frame between the upper and lower covers;
   an input/output connector provided at an end of the circuit board;
   a sheet member including a draw-processed sheet member treated with coloring or marking; and
   a transparent or translucent cover case; wherein the sheet member includes an upper portion and three side portions;

each of the upper portion and the three side portions of the sheet member is connected to one another by rounded joint portions;

the sheet member is fitted into the cover case such that the sheet member extends in close contact with an inner surface of the cover case;

the sheet member is a three-dimensional member;

each of the three side portions extends substantially perpendicularly downward from the upper portion;

the rounded joint portions connect the three side portions to the upper portion:

and the circuit board is sandwiched and held by the cover case and the frame such that the sheet member and the frame lie in contact with opposing surfaces of the circuit board.

2. The card-like computer peripheral device according to claim 1, wherein the sheet member includes a decorative film comprising resin.

3. The card-like computer peripheral device according to claim 2, wherein the decorative film comprises a transparent film having a rear surface treated with coloring or marking.

4. The card-like computer peripheral device according to claim 2, wherein the decorative film has a front surface treated with coloring or marking.

5. The card-like computer peripheral device according to claim 1, wherein the sheet member comprises paper.

6. The card-like computer peripheral device according to claim 1, wherein the sheet member comprises a metal sheet.

7. The card-like computer peripheral device according to claim 1, wherein the cover case and the sheet member are firmly fixed to each other.

8. A card-like computer peripheral device, comprising:

a frame having a groove formed along at least one side thereof;

upper and lower covers disposed on upper and lower sides of the frame;

a circuit board disposed within the frame between the upper and lower covers;

an input/output connector provided at an end of the circuit board;

a sheet member including a draw-processed sheet member treated with coloring or marking; and a transparent or translucent cover case; wherein the sheet member includes an upper portion and three side portions;

each of the upper portion and the three side portions of the sheet member is connected to one another by rounded joint portions; and at least one of the three side portions of the sheet member is inserted into the groove of the frame;

the transparent or translucent cover case and the frame are firmly fixed to each other so as to sandwich and hold a portion of the sheet member, including said at least one side;

the sheet member is a three-dimensional member;

each the three side portions extends substantially perpendicularly downward from the upper portion;

the rounded joint portions connect the three side portions to the upper portion:

and the circuit board is sandwiched and held by the cover case and the frame such that the sheet member and the frame lie in contact with opposing surfaces of the circuit board.

9. The card-like computer peripheral device according to claim 8, wherein the sheet member comprises at least one flange at the front thereof such that the flange is sandwiched and held by the cover case and the frame.

10. The card-like computer peripheral device according to claim 8, wherein the upper cover is firmly fixed to the cover case and the frame, and the lower cover is firmly fixed to the frame such that at least a colored or marked pattern printed on the sheet member is exposed.

11. The card-like computer peripheral device according to claim 1, wherein the sheet member is made of one of polystyrene, acrylonitrile-butadiene-styrene copolymer, acrylonitrile-styrene copolymer, polyvinyl chloride, methacrylic resin, cellulosic resin, polycarbonate, polyethylene, polypropylene, polyvinylidene chloride, polyacetal, polyamide, and fluorocarbon resin.

12. The card-like computer peripheral device according to claim 8, wherein steps are formed in the groove of the frame.

* * * * *